(12) United States Patent
Dormiani et al.

(10) Patent No.: US 9,594,855 B1
(45) Date of Patent: Mar. 14, 2017

(54) METHOD AND APPARATUS FOR LIGHTNING PROTECTION IN DENSELY PACKED HELIOSTAT FIELDS

(71) Applicant: eSolar, Inc., Burbank, CA (US)

(72) Inventors: Parsa Dormiani, San Mateo, CA (US); Carl Chin, Santa Monica, CA (US); Herach Ayvazian, Burbank, CA (US)

( * ) Notice: Subject to any disclaimer, the term of this patent is extended or adjusted under 35 U.S.C. 154(b) by 697 days.

(21) Appl. No.: 14/139,548

(22) Filed: Dec. 23, 2013

Related U.S. Application Data

(60) Provisional application No. 61/745,462, filed on Dec. 21, 2012.

(51) Int. Cl.
*G06G 7/48* (2006.01)
*G06F 17/50* (2006.01)

(52) U.S. Cl.
CPC .......... *G06F 17/5004* (2013.01); *Y02E 10/47* (2013.01)

(58) Field of Classification Search
CPC ..................................... Y02E 10/47

USPC .............................................. 703/6
See application file for complete search history.

(56) References Cited

PUBLICATIONS

Parise et al. The Lightning Protection of a Complex of Structures (Lpcs); IEEE I&CPS-05-11; pp. 99-105; 2005.*

* cited by examiner

*Primary Examiner* — Hugh Jones
(74) *Attorney, Agent, or Firm* — Brooks Acordia IP Law, P.C.; Pejman Yedidsion

(57) ABSTRACT

Methods, systems, and devices for determining the placement of one or more lightning rods in one or more circles of non-interference in a solar field, where the placement is based on a determined location of one or more ungrounded triangular heliostat structures and one or more circles of interference, where the one or more circles of interference are areas within a range of motion of one or more heliostats disposed on corners of the one or more triangular heliostat structures in the solar field.

19 Claims, 15 Drawing Sheets

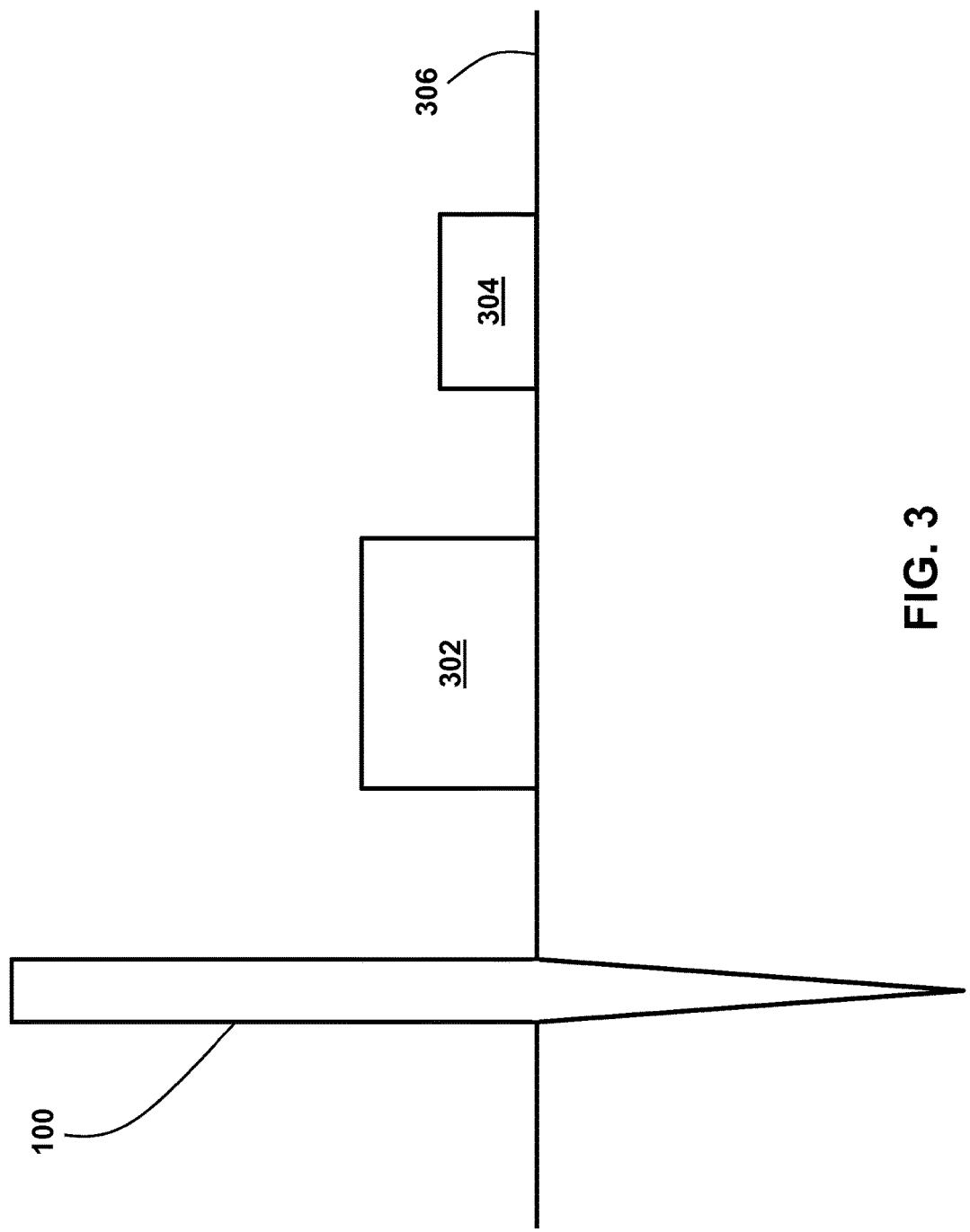

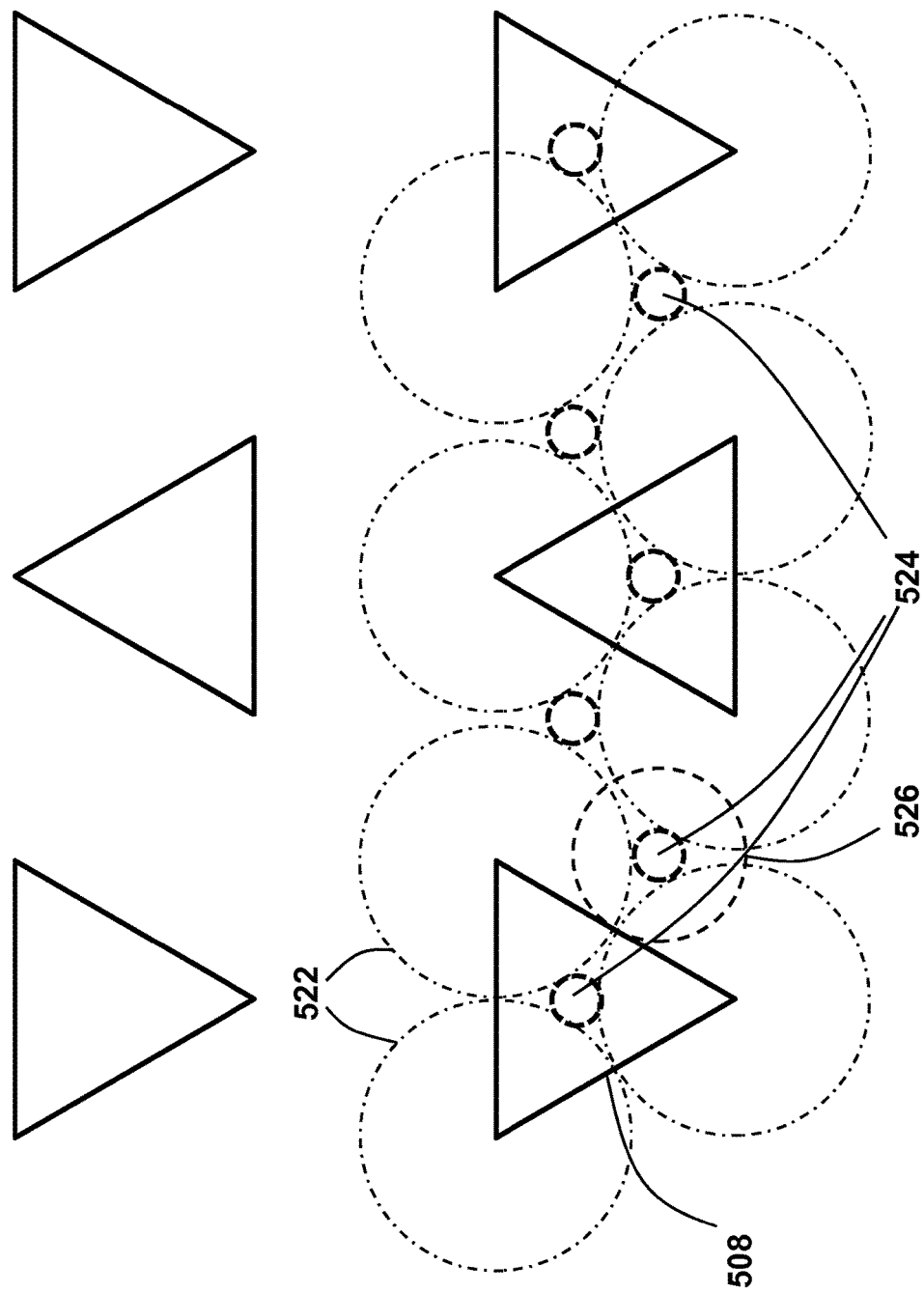

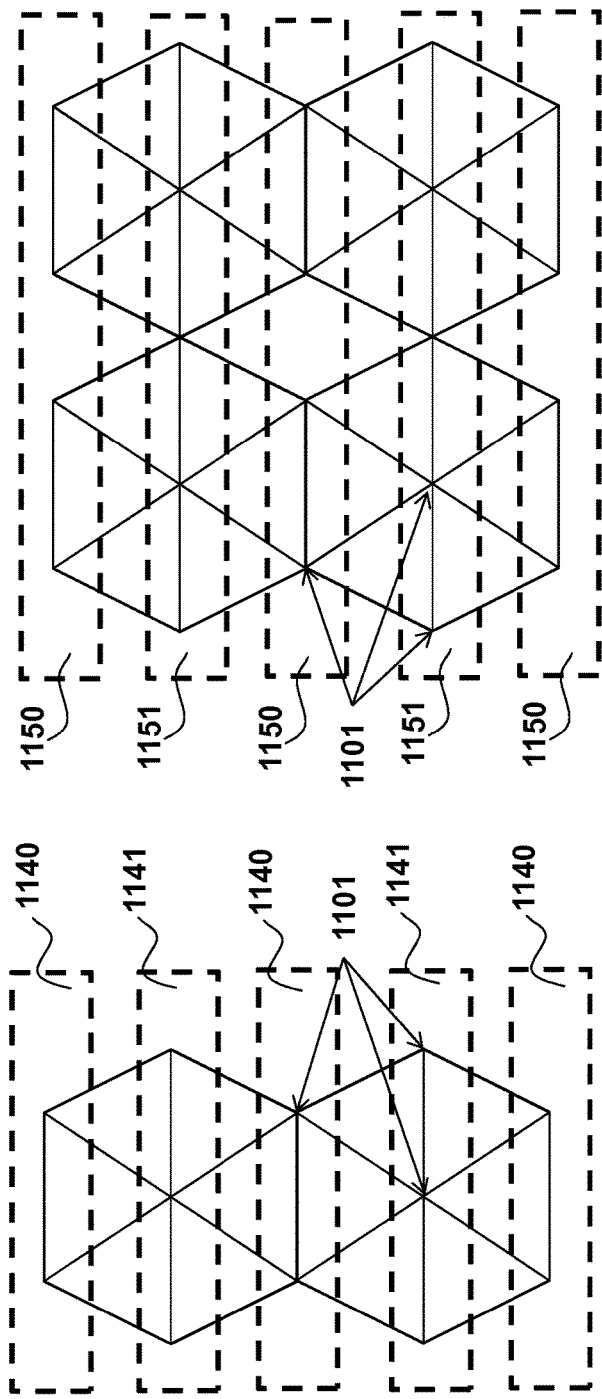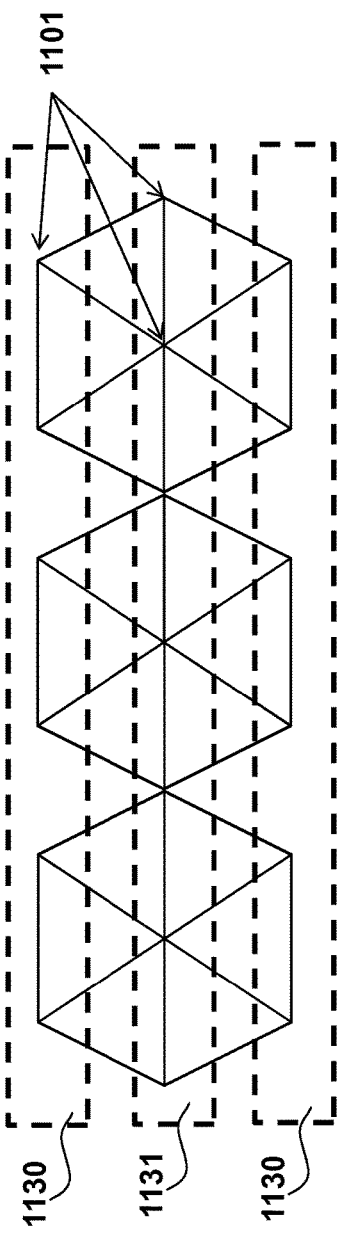
FIG. 11A
FIG. 11B
FIG. 11C

METHOD AND APPARATUS FOR LIGHTNING PROTECTION IN DENSELY PACKED HELIOSTAT FIELDS

CROSS-REFERENCE TO RELATED APPLICATIONS

This application claims priority to and the benefit of U.S. Provisional Patent Application Ser. No. 61/745,462, filed Dec. 21, 2012, which is hereby incorporated herein by reference in its entirety for all purposes.

FIELD OF ENDEAVOR

The invention relates to the field of concentrating solar thermal power and more particularly to methods, devices, and systems for reducing the risk of damage from lightning strikes in a solar field.

BACKGROUND

Concentrating solar thermal power plants utilize arrays of heliostats in one or more solar fields to reflect light onto a central receiver. These solar fields often contain many metallic structures, and any equipment located in the solar field may be at risk of damage from lightning strikes. Heliostat assemblies, and other equipment, may often be substantially metal and may sustain damage from lightning strikes. Conventional methods of lightning protection for solar fields involve the installation of large grounding grids that allow for any metallic structures to be readily connected to the grid. The installation of such a grid necessitates that the ground be dug up and often requires the use of a large amount of copper wiring. Other conventional methods of lightening protection include the installation of tall towers, which necessitates excavations and the deployment of footings, and foundations. Alternatively, installation of a greater number of smaller lightning rods may minimize ground protection at a reduced cost.

SUMMARY

Exemplary embodiments may include a solar collector field system with non-interference areas with lightning rods placed in the non-interference areas. In additional exemplary embodiments, the system may have a hexagonal heliostat packing layout. In additional exemplary embodiments, the lightning rods may comprise an air electrode mounted to a tower. In additional exemplary embodiments, the air electrode may be attached to a ground electrode by a jumper. In additional exemplary embodiments, there may be a heliostat packing density of 20 to 50%. In additional exemplary embodiments, the system may have a radial spacing packing arrangement. In additional exemplary embodiments, the air electrode may be mounted to a support structure.

Embodiments may include a method of a processor determining a location of one or more ungrounded triangular heliostat structures in a solar field; determining one or more circles of interference, where the one or more circles of interference are areas within a range of motion of one or more heliostats disposed on corners of the one or more triangular heliostat structures in the solar field; determining one or more circles of non-interference, where the one or more circles of non-interference are open spaces between the circles of interference; and determining a placement of one or more lightning rods in the one or more circles of non-interference. In one exemplary embodiment, the one or more heliostats structures may be arranged in rows with alternating rows of heliostat structures and clearance rows. In another exemplary embodiment the one or more heliostat structures may be arranged in a hexagonal packing along two or more rows. Additionally, the placement of the one or more lightning rods may be based on a rolling sphere method. In one exemplary embodiment, one of the one or more circles on interference may be located in a center of one of the one or more triangular heliostat structures.

Additionally, the determining of the placement of the one or more lightning rods in the one or more circles of non-interference may further comprise the processor: drawing a triangle, where each of the triangle vertices may be a center of one of the one or more determined circles of non-interference; determining a centroid of the drawn triangle; determining a minimum height and a spacing of three lightning rods placed at the drawn triangle vertices via a rolling sphere method; tiling the drawn triangle as a pattern over the solar field where the processor may overlay the drawn triangle as a pattern so as to cover the solar field; and determining a placement of a lightning rod at each vertex of the tiled triangle pattern.

In addition, in one exemplary embodiment, the method may further comprise: determining a base of non-interference, where the base of non-interference may be a swept area on the ground from a center of the one or more circles of non-interference to a nearest edge of at least one of: the one or more heliostat structures and solar field equipment in the solar field. Additionally, the determination of the one or more circles of interference may further comprise the areas of at least one of: clearance rows and solar field equipment. In one exemplary embodiment, the determined placement of the one or more lightning rods by the rolling sphere method may be in a hexagonal pattern. In another exemplary embodiment the method may further comprise: determining the number of lightning rods in the solar field in the hexagonal pattern by vertex counting. In some exemplary embodiments, the placement of the one or more lightning rods in the one or more circles of non-interference may further comprise placing a base of the lightning rod in a first determined circle of non-interference and placing an air electrode of the lightning rod in a second determined circle of non-interference. Optionally, the first determined circle of non-interference may have a larger volume than the second determined circle of non-interference.

Embodiments may also include a system comprising: a solar field; one or more ungrounded triangular heliostat structures located in the solar field; one or more heliostats disposed on corners of the one or more triangular heliostat structures; a processor having addressable memory, where the processor is configured to: determine one or more circles of interference, where the one or more circles of interference are areas within a range of motion of the one or more heliostats; determine one or more circles of non-interference, where the one or more circles of non-interference are open spaces between the circles of interference; and determine a placement of one or more lightning rods in the determined one or more circles of non-interference, where the placement of the one or more lightning rods is based on rolling sphere method. In one exemplary embodiment, the one or more heliostats may be arranged in a hexagonal heliostat packing. Optionally, the hexagonal heliostat packing may have a heliostat packing density of 20% to 50%. In another exemplary embodiment, the one or more lightning rods may comprise an air electrode located above the ground surface and a ground electrode located in the ground. Additionally, the air electrode may be detachably attached to the ground electrode and the air electrode may be attached to a support structure. In one exemplary embodiment, the ground electrode may be located in a first determined circle of non-interference and the air electrode is located in a second determined circle of non-interference, where the first determined circle of non-interference may have a larger volume than the second determined circle of non-interference. Optionally, the ground electrode may comprise one or more stakes used to support the air electrode.

Embodiments may also include a device comprising a processor and addressable memory, the processor configured to: determine a location of one or more ungrounded triangular heliostat structures in a solar field; determine one or more circles of interference, where the one or more circles of interference are areas within a range of motion of one or more heliostats disposed on corners of the one or more triangular heliostat structures in the solar field; determine one or more circles of non-interference, where the one or more circles of non-interference are open spaces between the circles of interference; and determine a placement of one or more lightning rods in the one or more circles of non-interference, where the placement of the one or more lightning rods is based on a rolling sphere method.

BRIEF DESCRIPTION OF DRAWINGS

Embodiments are illustrated by way of example and not limitation in the figures of the accompanying drawings, in which:

FIG. 3 depicts an exemplary lightning rod inserted into the ground;

FIG. 5C depicts a top view of an exemplary solar field with circles of non-interference for the potential placement of lightning rods;

FIGS. 11A-11C depict exemplary arrangements of hexagonally-packed heliostat structures.

DETAILED DESCRIPTION

Figure 1:
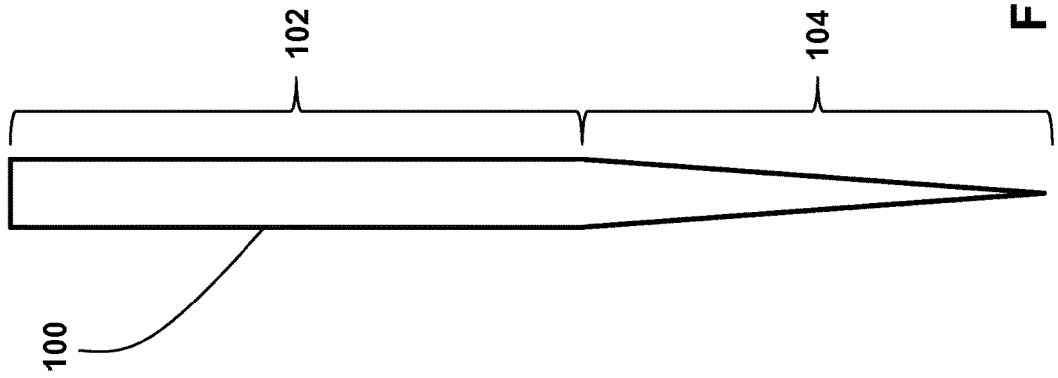
FIG. 1 depicts an exemplary single piece lightning rod comprising an air electrode and a ground electrode.

FIG. 1 depicts an exemplary single piece lightning rod 100 comprising an air electrode 102 and a ground electrode 104. The lightning rod 100 may comprise a long metallic pole. The air electrode 102 is located above the ground surface, and may extend above other field equipment, e.g., heliostats. This may provide a more attractive target for lightning to strike, and thereby serve to intercept lightning that would have otherwise struck field equipment (See FIG. 3). The ground electrode 104 is located in the ground, and may have a tapered end to aid in installation. In this exemplary embodiment, the lightning rod 100 is a single piece encompassing both the air electrode 102 and the ground electrode 104. There may be a permanent connection between the air electrode 102 and the ground electrode 104 to ensure low maintenance.

Figure 2:
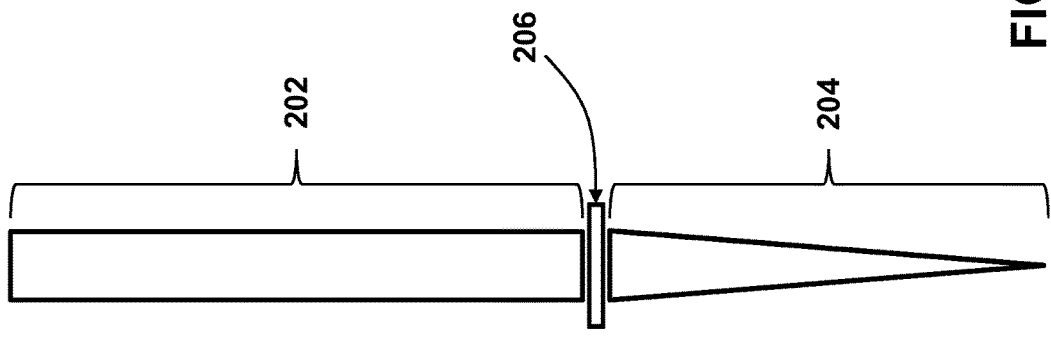
FIG. 2 depicts an exemplary multiple piece lightning rod assembly comprising an air electrode, a ground electrode, and a fastener.

FIG. 2 depicts an exemplary multiple piece lightning rod assembly 200 comprising an air electrode 202, a ground electrode 204, and a fastener 206. In some embodiments, the lightning rod assembly 200 may comprise two separate pieces, where the air terminal 202 and the ground terminal 204 may be detachably attached via a fastener 206. The separate air electrode 202 is located above the ground, and extends above the ground at a height greater than the nearby equipment to be protected, e.g., at least five meters above the ground. The height of the air electrode 202 is variable as a function of the number of rods utilized in the solar field. Densely packed air electrodes 202 may be shorter, and vice versa. The separate ground electrode 204 is driven into the ground to a depth that may be dependent on soil resistivity. The exemplary multiple part lightning rod assembly 200 may allow for easier packaging and/or installation. In some embodiments, the ground electrode 204 may be inserted into the ground prior to being attached to the air electrode 202. This may be necessary during the installation of the solar field, since the height of the air electrode 202 may be greater than the height of all surrounding equipment and components and thus cause interference during the installation process.

FIG. 3 depicts an exemplary lightning rod 100 inserted into the ground 306. The lightning rod 100 provides a more attractive target for lightning to strike, and thereby serves to intercept lightning and direct it away from nearby field equipment 302,304. The lightning rod 100 protects this nearby equipment 302,304 from damage or destruction due to lightning strikes. The lightning rod 100 placement may increase safety in a solar field, since lightning currents may induce high surge voltages on metal parts. In addition to equipment damage, lightning currents may present a danger to worker personnel that may be present in the solar field at various times, e.g., due to routine maintenance or calibration. The placement of lightning rods 100 throughout the field may mitigate such safety risks. The use of lightning rods may also reduce, or eliminate, certain grounding requirements for heliostats as heliostat components may not need to be built to sustain lightning currents. Further, conducting components in the heliostat assembly may not need to be fastened in such a way as to allow for the large current of a lightning strike to pass through them. In some embodiments, there may be a permanent connection in the lightning rod 100 to reduce maintenance requirements.

Figure 4:
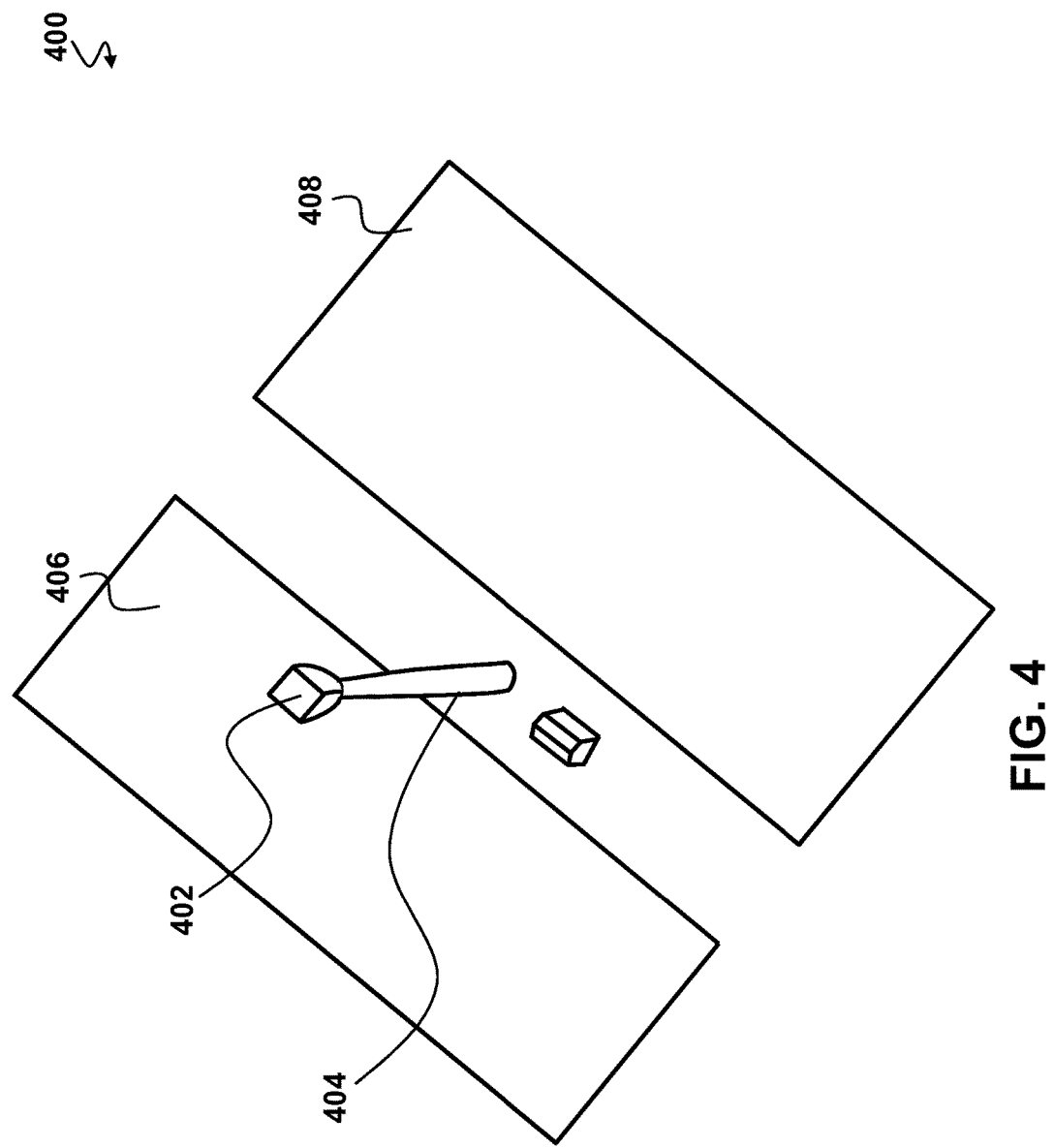
FIG. 4 depicts a perspective view of an exemplary concentrating solar thermal power plant with a central receiver and two solar fields.

FIG. 4 depicts a perspective view of an exemplary concentrating solar thermal power plant 400 with a central receiver 402 and two solar fields 406,408. The central receiver 402 may be positioned atop a tower 404 between a first solar field 406 and a second solar field 408. An exemplary solar plant 400 may comprise one or more central receivers 402 receiving reflected incident Sunlight from one or more corresponding solar fields 406,408 reflecting incident Sunlight to a corresponding central receiver 402. Each solar field 406,408 may comprise rows of heliostat structures (See FIGS. 5A-5C) and corresponding heliostats.

Figure 5A:
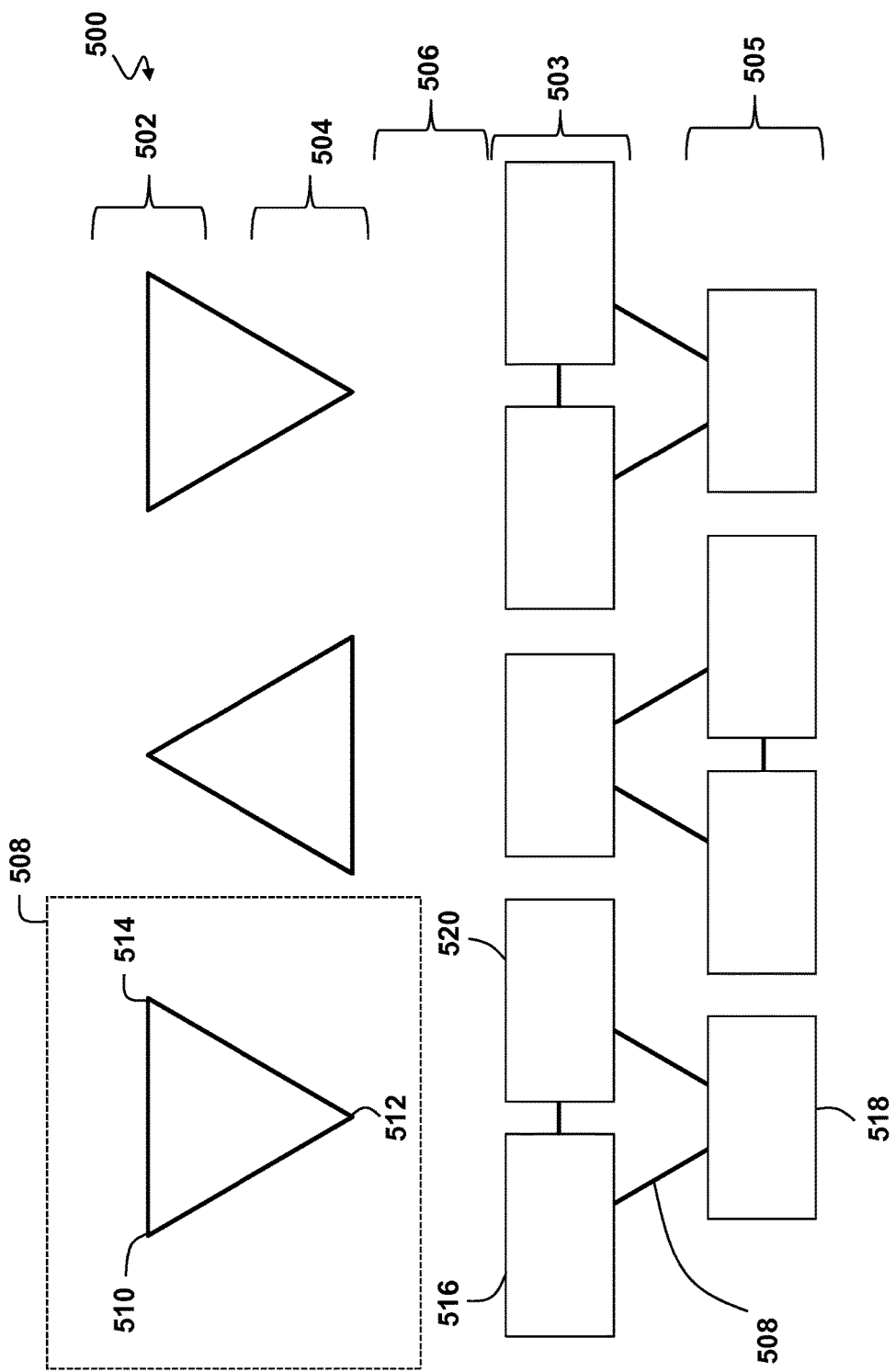
FIG. 5A depicts a top view of an exemplary triangular heliostat structure and two rows of heliostats comprising a plurality of structures.

FIG. 5A depicts a top view of an exemplary solar field 500 having heliostat structures 508 arranged in a hexagonal packing. The heliostat structures 508 may be arranged in a hexagonal packing layout to define two or more rows 502,504,503,505. Rows 502,504 depict three heliostat structures without any heliostats for purposes of illustration. There may be a clearance row 506 adjacent to consecutive rows 502,504,503,505 of heliostat structures to allow for maintenance access. Each solar field may comprise a plurality of heliostat rows 502,504,503,505 and corresponding clearance rows 506 for maintenance access. Each heliostat structure 508 may support up to three heliostats 516,518,520 positioned over corresponding structure corners 510,512, 514, respectively. The triangle configuration of the heliostat structures facilitates a high density field layout, wherein a plurality of neighboring heliostat structures can be positioned into hexagon-shaped subgroups. In such a hexagonally packed field, the triangular spacing of the heliostats 516,518,520 in a single structure provides a number of options for positioning lightning rods in an optimum manner (See FIG. 5C). For instance, placing lightning rods in an equilateral triangle pattern may provide the most efficient packing density for the lightning rods per unit area, which may reduce costs and/or installation time. In some embodiments, restrictions in access areas for lightning rods may necessitate that the lightning rods be arranged in isosceles triangle patterns or irregular triangle patterns. The equilateral triangle pattern of the heliostats 516,518,520 is a good fit for the equilateral spacing of the heliostat structures 508. The heliostat packing density, defined as the ratio between the surface area of the heliostat reflectors and the total land area upon which the heliostats are installed, in this dense hexagonal configuration may range from 20% to 50%. Using a hexagonal packing with a rectangular reflector may produce a packing density of approximately 47%. In some embodiments, alternative spacing configurations may be used, e.g., the heliostats can be arranged in structures exhibiting an isosceles triangle layout. In other embodiments, heliostat structures may be installed in non-uniform packing arrangements to reduce heliostat blocking, e.g., radial spacing.

Figure 5B:
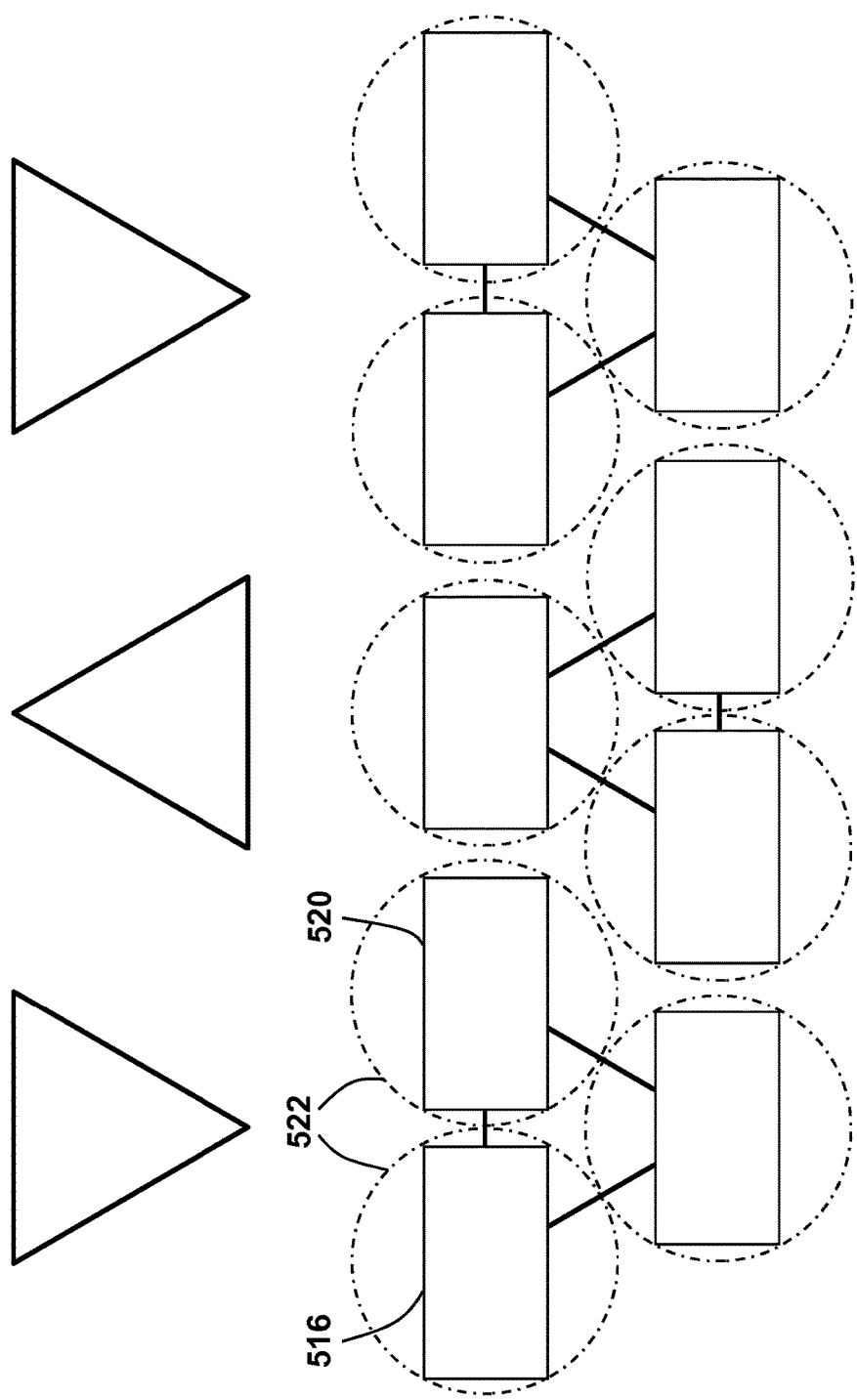
FIG. 5B depicts a top view of an exemplary solar field with circles of interference from each heliostat.

FIG. 5B depicts a top view of an exemplary solar field with circles of interference 522 from each heliostat 516,520. Each heliostat 516,520 has a range of motion needed to accurately track the Sun and reflect flux toward a central receiver (See FIG. 4). The area within this range of motion may be depicted as a circle of interference 522 around each heliostat 516,520. Lightning rods may not be placed within these circles of interference 522, because the height of the lightning rods may be greater than the height of the heliostats 516,520. Such a placement would either limit the range of motion of a heliostat 516,520 or result in a collision between a heliostat 516,520 and the lightning rod within the circle of interference 522 of that heliostat 516,520.

FIG. 5C depicts a top view of an exemplary solar field with circles of non-interference 524 for the potential placement of lightning rods. Circles of non-interference 524 are located in open spaces between the circles of interference 522. A base of non-interference 526 is determined by locating a swept area on the ground from the center of the circle of non-interference 524 to the nearest edge of a heliostat structure 508. The base of non-interference 526 is the maximum possible size of the base of the lightning rod. The base of non-interference 526 is calculated by determining the maximal radius that a lightning rod base can sweep over without creating interference with other heliostat structures 508 or other equipment in the heliostat field. The circle of non-interference 524 provides openings for potential placement of lightning rods. Lightning protection may be placed in any of the areas of a heliostat field that have non-interference. In this exemplary dense hexagonal field, this occurs in the middle of each heliostat structure 508 as well as in additional non-interference areas, including the circles of non-interference 524, between heliostat structures 508. Lightning rods may be placed in any non-interference area, but it may be advantageous to place them in non-interference areas that are outside of heliostat rows to enable space for service and maintenance activities.

In one embodiment, the height, packing density, and spacing between lightning rods may be determined by the rolling sphere method. The rolling sphere method involves superimposing an imaginary sphere of a given size on the ground proximate to objects that may be vulnerable to lightning strikes. The imaginary sphere is then rolled over the objects, and any surface that makes contact with the sphere is determined to not be protected against lightning. The addition of lightning rods or towers of a certain height in the path of the sphere may define a zone of protection. In an embodiment of the present system, the lightning rods are arranged in triangle formations throughout the heliostat field. The height and spacing of the lightning rods in a triangle formation may be selected such that an imaginary sphere of a predetermined radius may rest on all three rods simultaneously and not make contact with the heliostats and conducting equipment in the field. The vertices of the triangle formation are set within circles of non-interference as defined above. If a vertex of the triangle formation does not fall exactly within a non-interference area, a nearby non-interference area may be chosen such that the length of each of the sides of the triangle is within ten-percent of each of the other two sides of the triangle.

Figure 6:
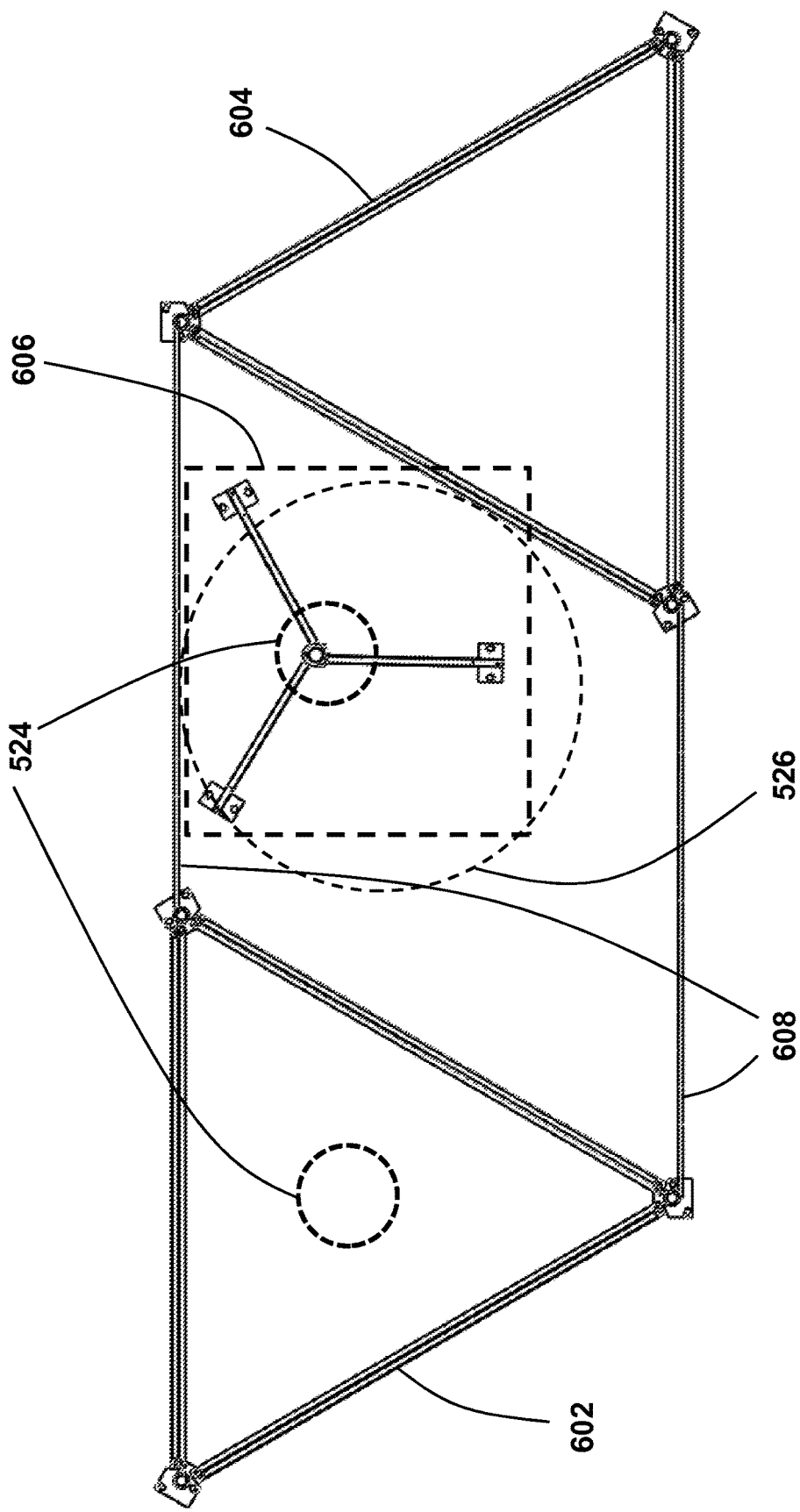
FIG. 6 depicts a top view of exemplary installed adjacent heliostat structures having a lightning rod in between them.

FIG. 6 depicts a top view of exemplary installed adjacent heliostat structures 602,604 having a lightning rod 606 in between these heliostat structures 602,604 located in a circle of non-interference 524 between heliostat structures 602, 604. The circle of non-interference 524 extends from ground level up to several yards above the reflectors of the heliostat structure. The base of non-interference 526 is the area that the base of the lightning rod can be placed in without interference from heliostat structures 602,604. Cables 608 may provide a method of transmitting data and/or power between each heliostat structure 602,604.

Figure 7:
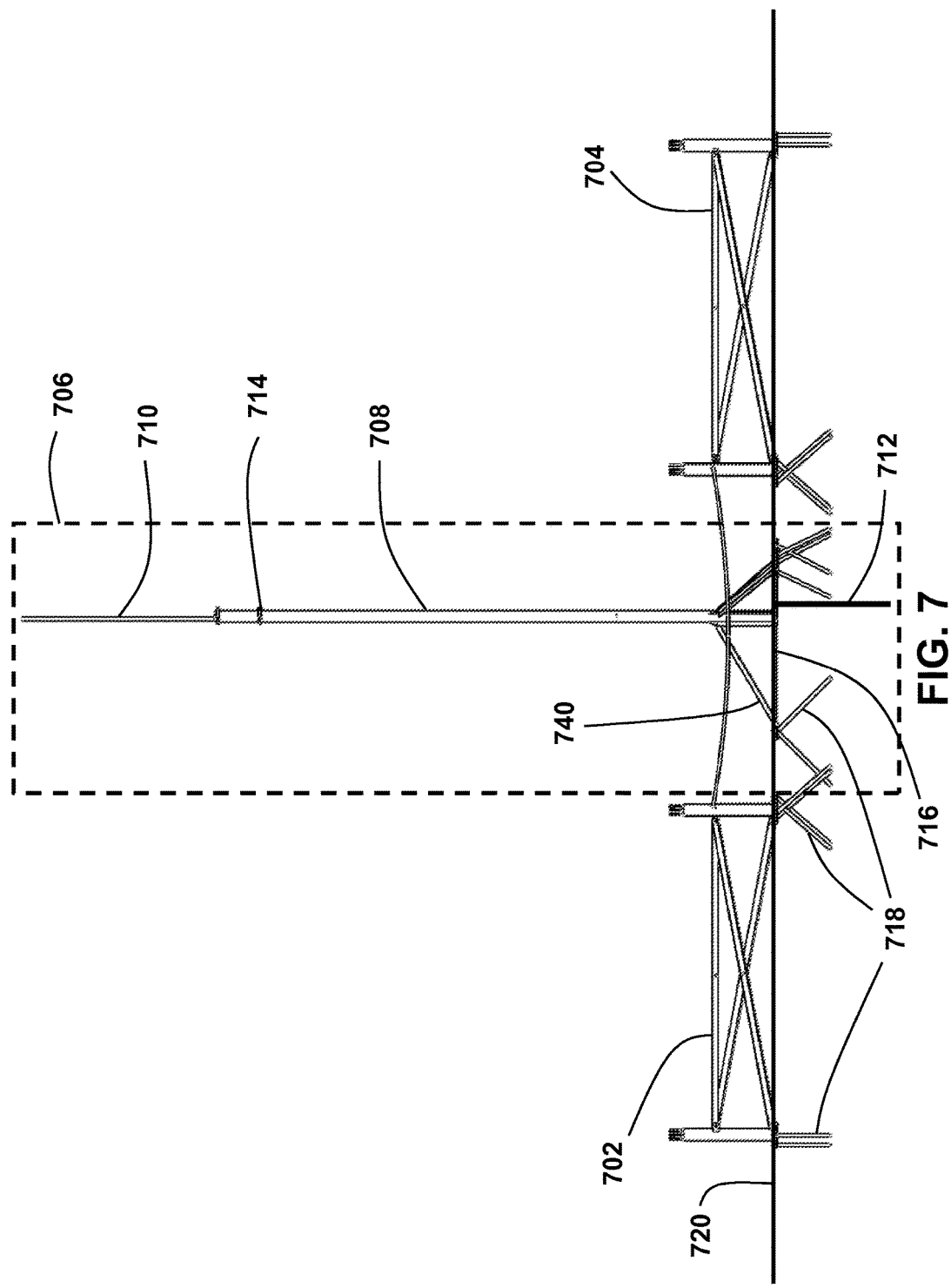
FIG. 7 depicts a side view of exemplary installed adjacent heliostat structures having a lightning rod in between them.

FIG. 7 depicts a side view of exemplary installed adjacent heliostat structures 702,704 having a lightning rod 706 in between them. In some embodiments, the lightning rod 706 may be made from a tower 708 with a conductive path 710, e.g., a copper wire that leads to a ground electrode 712. The conductive path 710 may be attached to the tower 708 by a fastener 714. The tower itself may be made of one or more pieces. A lightning rod base 716 provides support to the tower 708. Stakes 718 may be substantially driven into the ground 720 to secure the heliostat structures 702,704 and/or the lightning rod base 716. The ground electrode 712 may also be substantially driven into the ground 720. The ground electrode 712 is connected to the conductive path 710 to provide a path for the discharge of lightning energy into the ground. In another exemplary embodiment, the lightning rod 706 may have two or more tower feet 740 to provide stability. In exemplary embodiments where stakes are not a viable option, alternatives, e.g., loose sand or ballast (not shown) may be used to secure the lightning rod 706. In one embodiment, the air electrode of the tower 708 may be made integral with the tower feet 740. In other exemplary embodiments, the air electrode may comprise a conductive material that is attached to the tower 708, and this air electrode may then be connected to the ground electrode 712. The connection of the air electrode and the ground electrode 712 may be by a physical connection, a conducting flexible cable, and/or a conducting jumper.

Figure 8:
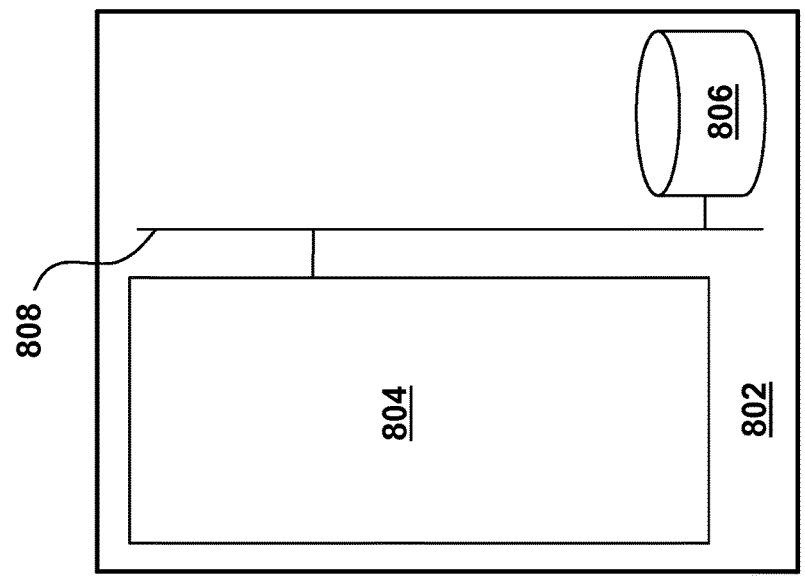
FIG. 8 depicts an exemplary control processing unit for determining the placement of one or more lightning rods.

FIG. 8 depicts an exemplary control processing unit 800 for determining the placement of one or more lightning rods. The system may comprise one or more control processing units 802 having a processor 804 and memory 806 addressable with a data bus 808. The one or more processing units 802 may be used to determine the placement of one or more lightning rods in a solar field. The one or more processing units 802 may calculate the non-interference area and may determine the placement of the one or more lightning rods in this non-interference area by, for example, using the rolling sphere method.

Figure 9:
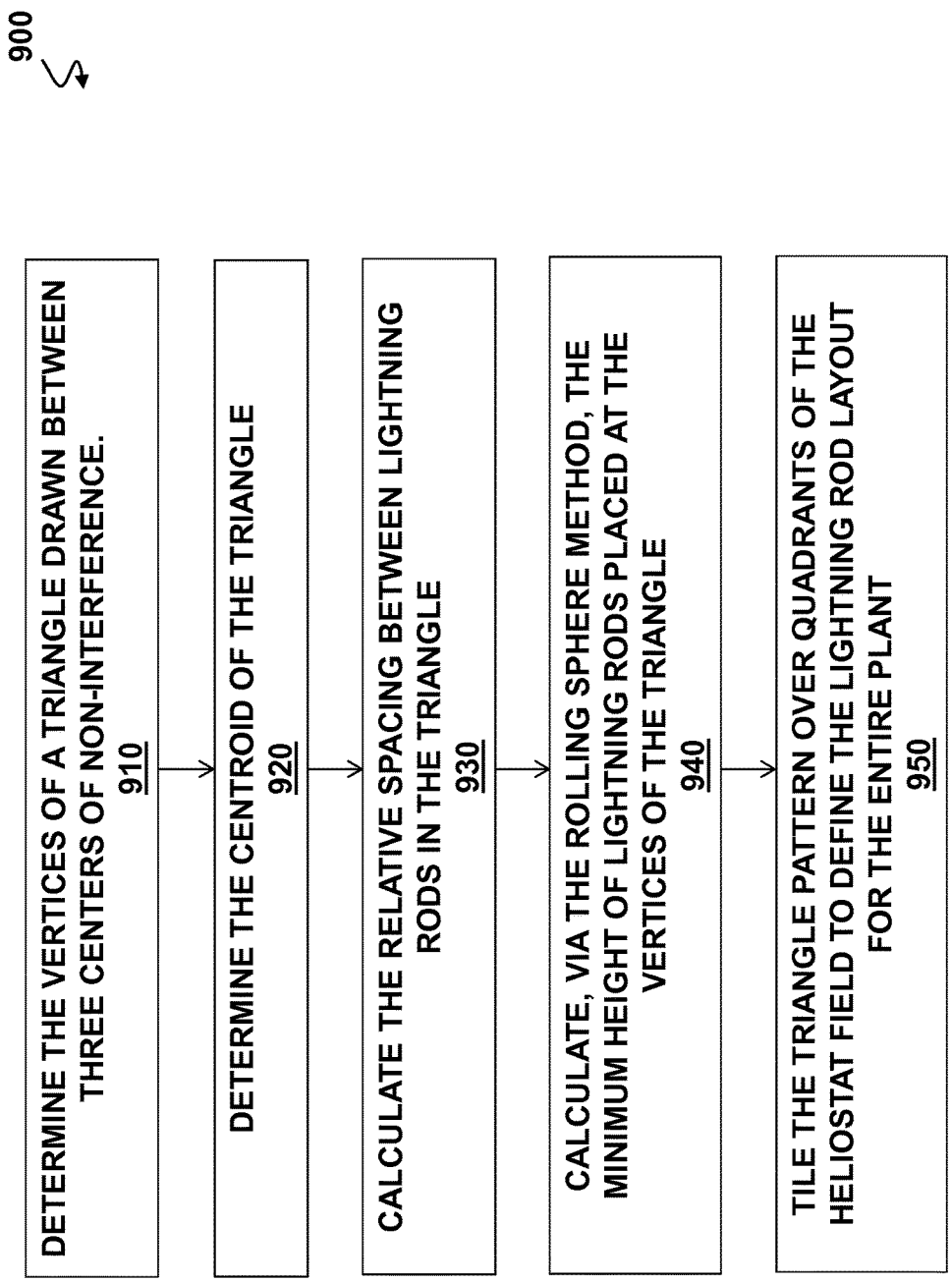
FIG. 9 depicts a flow chart of a method of calculating optimal positions for installing lightning rods in a hexagonally packed heliostat field.

FIG. 9 depicts a flow chart of an exemplary method of calculating lightning rod position in a hexagonally packed heliostat field. The derivation is performed through the following steps by one or more processors. First, the processor determines the vertices of a triangle drawn using the centers of three circles of non-interference in the heliostat field (step 910). This may be done by drawing a triangle over a portion of the heliostat field and performing a search for the nearest circle of non-interference to the triangle vertices, followed by defining an updated triangle using the centers of the circles of non-interference as the new vertices. This updated triangle is drawn to approximate an equilateral triangle with the length of each side being within 10% of the others. Next, the processor calculates the centroid of said triangle having as vertices the centers of the three circles of non-interference (step 920). Next, the processor may calculate the spacing between lightning rods in the triangle (step 930). Thereupon the processor calculates, via the rolling sphere method, a height of the lightning rods to be positioned at the vertices of the updated triangle. The lightning rod height may be selected as the minimum height at which a sphere having a predetermined radius may rest on three lightning rods to be placed without making contact with the heliostat structures, or other electrical and metal equipment, in the balance of the plant (step 940). In other embodiments, alternate lightning rods having heights of longer or shorter lengths may be used to meet project specific requirements. Once the triangle defining the relative spacing of the three lightning rods has been determined, the triangle may be tiled over a quadrant of the field to define a patterned layout of lightning rods (step 950). In additional embodiments, the processor may determine the relative spacing between the lightning rods for a predetermined lightning rod height or determine the lightning rod height using predetermined lightning rod spacing.

Figure 10A:
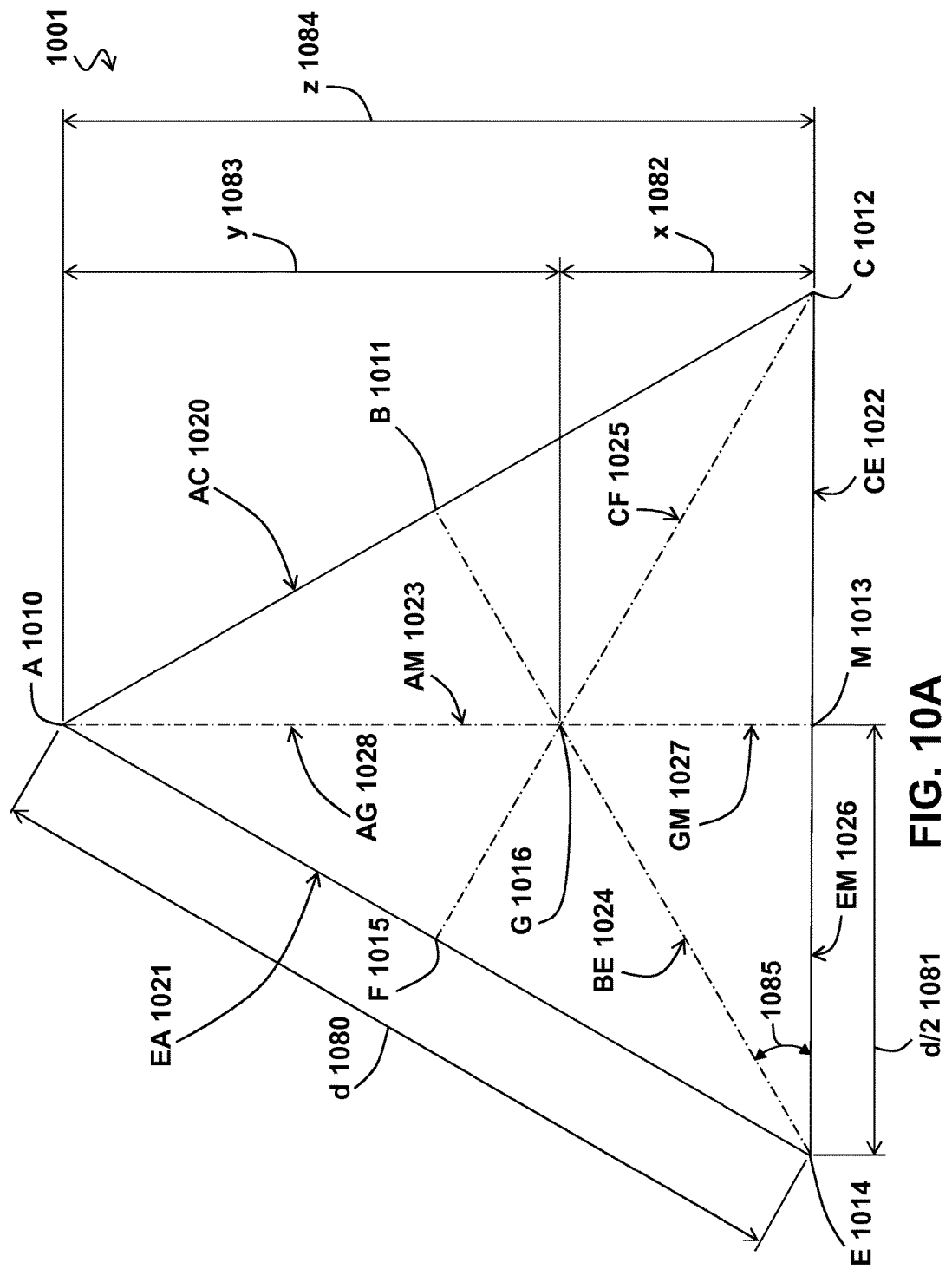
FIG. 10A depicts the geometric characteristics of a triangle drawn between three lightning rods.
Figure 10B:
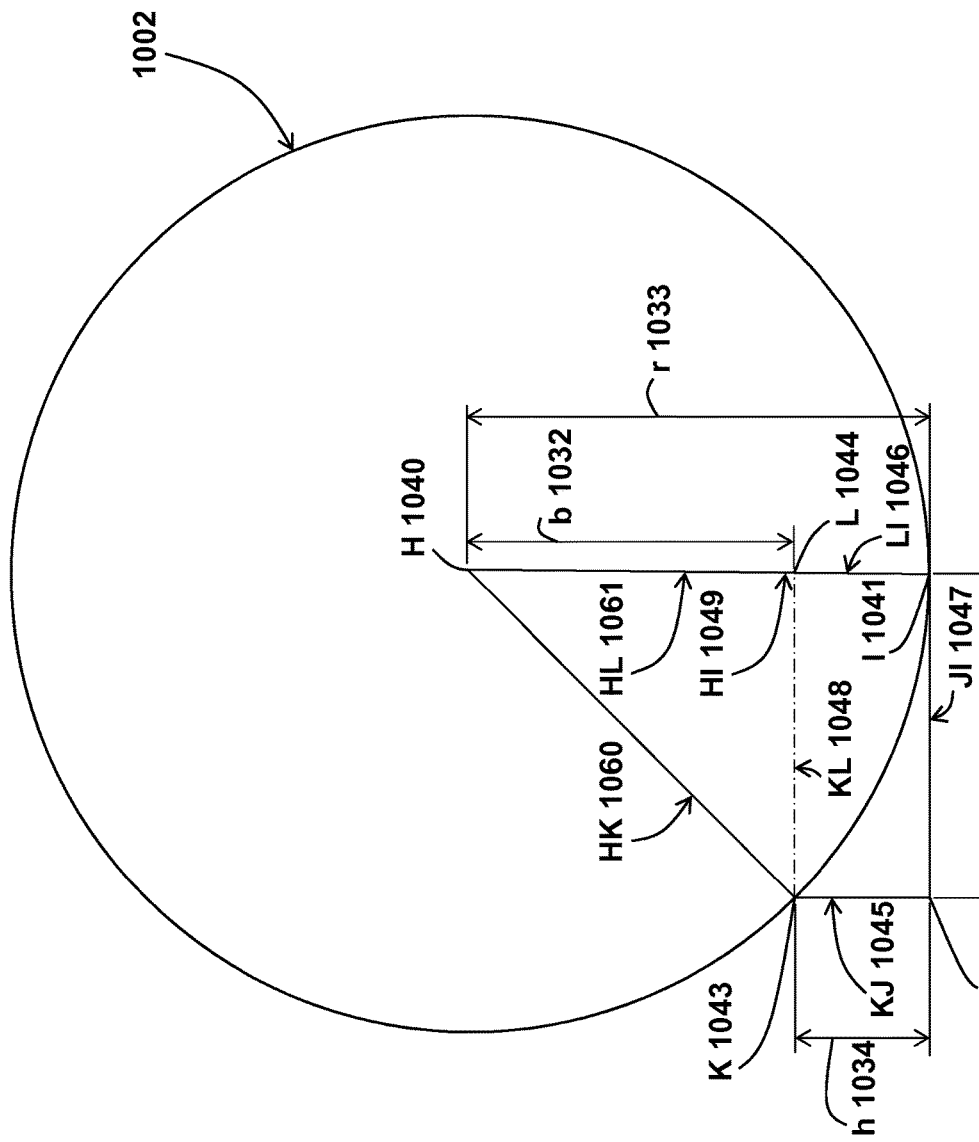
FIG. 10B depicts a characteristic cross section of a sphere for use in the rolling sphere derivation of optimal lightning rod height and spacing.
Figure 10C:
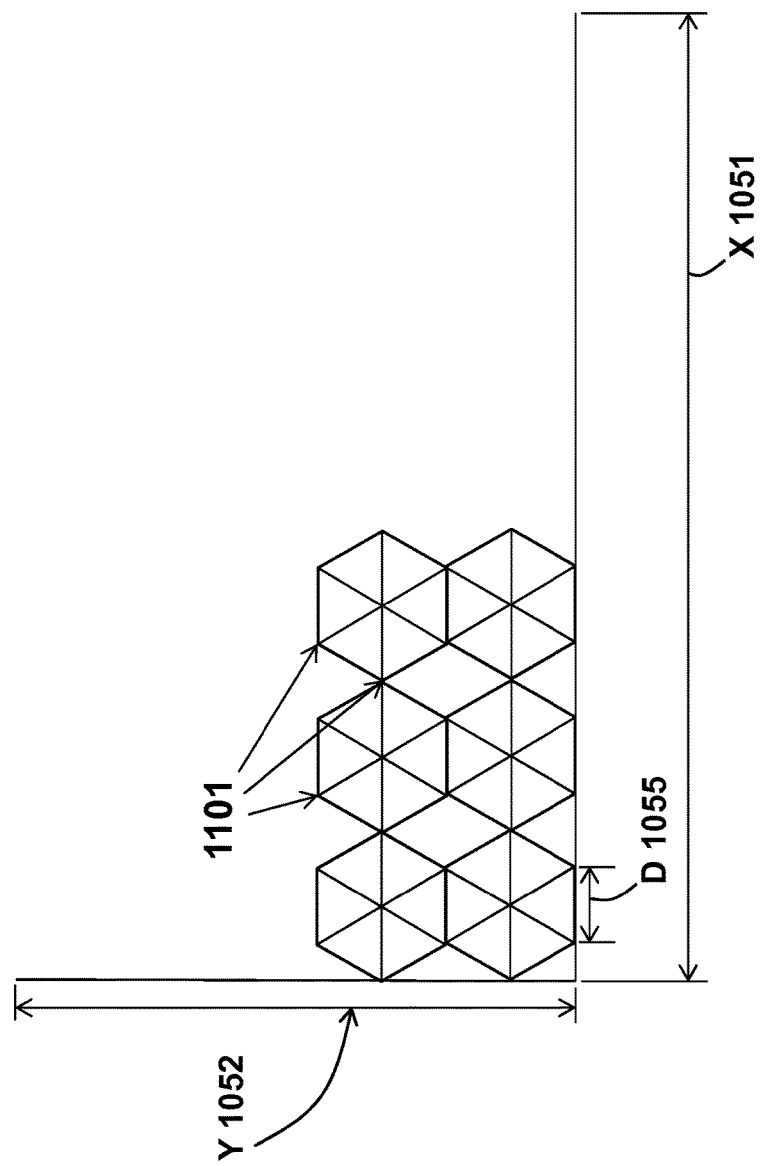
FIG. 10C depicts a top view of an exemplary solar field having heliostat structures arranged in a hexagonal packing.

FIGS. 10A to 10C illustrate a method of tiling the equilateral triangle spacing for lightning rods in a heliostat field. In particular, this method may be used to approximate the equilateral triangle spacing, where any of the sides of the triangle is at most+/−10% of the length of any of the other sides of the triangle.

FIG. 10A depicts an equilateral spacing of lightning rods. The equilateral triangle 1001 has rods placed at a distance d 1080 at Points A 1010, C 1012, and E 1014. Points A 1010 and C 1012 create side AC 1020. Points C 1012 and E 1014 create side CE 1022. Points E 1014 and A 1010 create side EA 1021. Sides AC 1020, CE 1022, and EA 1021 are each of length d 1080. Points F 1015, M 1013, and B 1011 are created by bisecting the angle on the opposite side of the equilateral triangle, generating a thirty-degree angle 1085. Point G 1016 is the centroid of the triangle and is located at the intersection of bisecting lines BE 1024, CF 1025, and AM 1023. The length of line AG 1028 is equal to the value of y, the length of line GM 1027 is equal to the value of x, the length of line AM 1023 is equal to the value z, and the length of line EM 1026 is d/2 1081.

The following system of equations may then be used to calculate positions of the rods:

$$z=((sqrt(3)/2)*d)$$

$$x=(d/(2*sqrt(3)))$$

$$y=z-x=(sqrt(3)*d/2)-(d/(2*sqrt(3)))=d/(sqrt(3)).$$

FIG. 10B depicts a cross-section of a sphere resting on a midpoint of the triangle shown in FIG. 10A. This cross-section, if using an equilateral triangle, is identical when taken along line AM 1023, line CF 1025, or line BE 1024 of FIG. 10A. The rolling sphere radius r 1033 is placed at the center of a circle located at point H 1040. The height of the lightning rod is indicated by KJ 1045 with height h 1034. Line JI 1047 is the ground and is tangent to the cross-section of the sphere 1002 at point I 1041. Line KL 1048 is a line normal to line HI 1049 that intersects point K 1043 where the sphere makes contact with the lightning rod. Line KL 1048 is the same length as line JI 1047, which is given the value of a 1031. When a right triangle is formed from points H 1040, L 1044, and K 1043, line HK 1060 is equal to r 1033, side KL 1048 is equal to a 1031, and line HL 1061 is equal to b 1032. From this, line JI 1047 is equal in length to y from the equilateral triangle shown in FIG. 10A, resulting in:

$$a=d/sqrt(3)$$

Line HL is equal to length b, where:

$$b=sqrt(r^2-a^2)=sqrt(r^2-(d/sqrt(3))^2).$$

Where this also produces a spacing for a given rod height h 1034 to have a maximum spacing distance d $$d=sqrt(3)*sqrt(r^2-(r-h)^2)$$

FIG. 10C depicts an exemplary layout for a hexagonally-packed heliostat field 1003. In general, the number of hexagons that can fit in a rectangular region with dimensions X 1051 by Y 1052 is X/(2*D), where D 1055 is the spacing between posts of the heliostat structure. The number of hexagons in a vertical column in a rectangular region x 1051 by y 1052 can be calculated with the equation (Y/D*sqrt(3)). The vertices 1101 indicate where a lightning rod is to be placed in the field.

FIGS. 11A through 11C depict an exemplary vertex counting method for utilizing a hexagonal pattern of lightning rod deployment. Vertices 1101 are counted by rows. In one embodiment, the vertex counting method may server to derive an estimate for the number of required lightning rods versus the rod spacing for a given bounded area. In odd rows, the number of vertices is twice the number of hexagons that can fit in a horizontal row multiplied by the number of odd horizontal rows. In even rows, the number of vertices is twice the number of hexagons that can fit in a row multiplied by the number of even horizontal rows plus one. The calculations in FIGS. 11A-11C use regular hexagonal heliostat packing. In some embodiments, irregular polygons may be used in a similar manner to calculate lightning rod spacing.

FIG. 11A depicts an arrangement with three odd rows 1140 and two even rows 1141. Horizontal rows alternate between odd rows and even rows, beginning with an odd row. Vertices 1101 are counted in both odd rows and even rows. In this example, odd rows 1140 have twice the number of hexagons in the row multiplied by the number of odd rows (2*1*3), or six vertices. Even rows 1141 have twice the number of hexagons in the row plus one multiplied by the number of even rows (((2*1)+1)*2), which is six vertices. The total number of vertices is obtained by combining the number of vertices in the odd rows with the number of vertices in the even rows (6+6), or twelve vertices. This number represents the number of required lightning rods for the area bounded by the hexagons in the heliostat field.

FIG. 11B depicts an arrangement with three odd rows 1150 and two even rows 1151. In this example, odd rows 1150 have twice the number of hexagons in the row multiplied by the number of odd rows (2*2*3), or twelve vertices. Even rows 1151 have twice the number of hexagons in the row plus one multiplied by the number of even rows (((2*2)+1)*2), which is ten vertices. The total number of vertices is obtained by combining the number of vertices in the odd rows with the number of vertices in the even rows (12+10), or twenty-two vertices. This number represents the number of required lightning rods for the area bounded by the hexagons in the heliostat field.

FIG. 11C depicts an arrangement with two odd rows 1130 and one even row 1131. In this example, odd rows 1130 have twice the number of hexagons in the row multiplied by the number of odd rows (2*3*2), or twelve vertices. Even rows 1131 have twice the number of hexagons in the row plus one multiplied by the number of even rows (((2*3)+1)*1), which is seven vertices. The total number of vertices is obtained by combining the number of vertices in the odd rows with the number of vertices in the even rows (12+7), or nineteen vertices. This number represents the number of required lightning rods for the area bounded by the hexagons in the heliostat field.

Figure 12:
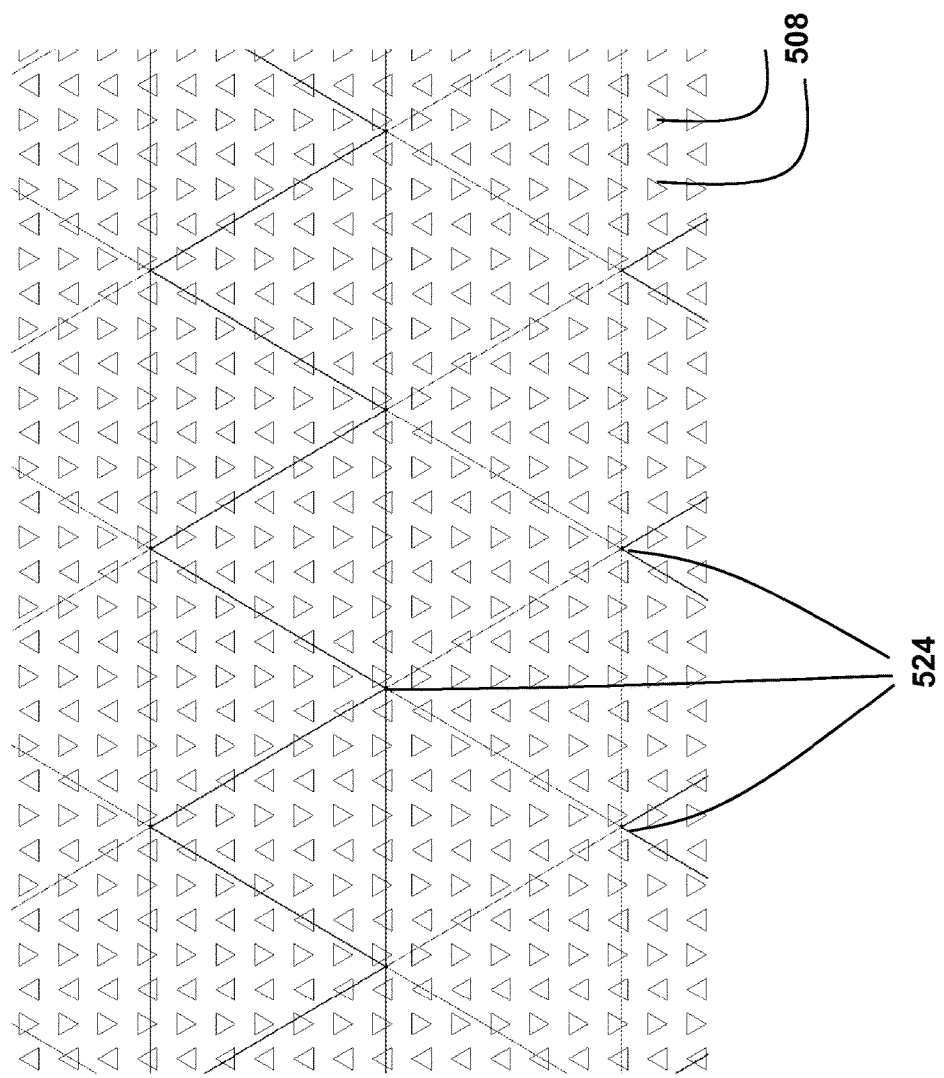
FIG. 12 depicts the positions of lightning rods in the heliostat field.

FIG. 12 depicts a result of processor calculations for lightning rods placements in a solar field. Specific circles of non-interference 524 are identified for lightning rod placement in areas between heliostat structures 508. The specific circles of non-interference 524 for lightning rod placement are depicted in FIG. 12 as using equilateral triangles. In some embodiments, the exact location of a vertex of an equilateral triangle may fall outside of a circle of non-interference, and the location of the lightning rod may be moved to a nearby circle of non-interference in order to approximate equilateral triangle spacing. In this case, any of the sides of the triangle may be at most within ten-percent or less of the length of any of the other sides. In other embodiments, isosceles triangle patterns or irregular triangle patterns may be used due to restrictions in access areas for lightning rods.

It is contemplated that various combinations and/or sub-combinations of the specific features and aspects of the above embodiments may be made and still fall within the scope of the invention. Accordingly, it should be understood that various features and aspects of the disclosed embodiments may be combined with or substituted for one another in order to form varying modes of the disclosed invention. Further it is intended that the scope of the present invention herein disclosed by way of examples should not be limited by the particular disclosed embodiments described above.

What is claimed is:

1. A method comprising:
    determining, by a processor having an addressable memory, a location of one or more ungrounded triangular heliostat structures in a solar field;
    determining, by the processor, one or more circles of interference, wherein the one or more circles of interference are areas within a range of motion of one or more heliostats disposed on corners of the one or more triangular heliostat structures in the solar field;
    determining, by the processor, one or more circles of non-interference, wherein the one or more circles of non-interference are open spaces between the circles of interference; and
    determining, by the processor, a placement of one or more lightning rods in the one or more circles of non-interference, wherein the placement of the one or more lightning rods is based on a rolling sphere method.

2. The method of claim 1, wherein the one or more heliostats structures are arranged in rows with alternating rows of heliostat structures and clearance rows.

3. The method of claim 2, wherein the one or more heliostat structures are arranged in a hexagonal packing along two or more rows.

4. The method of claim 1, wherein determining the placement of the one or more lightning rods in the one or more circles of non-interference further comprises:
    drawing, by the processor, a triangle, wherein each of the triangle vertices is a center of one of the one or more determined circles of non-interference;
    determining, by the processor, a centroid of the drawn triangle;
    determining, by the processor, a minimum height and a spacing of three lightning rods placed at the drawn triangle vertices via a rolling sphere method;
    tiling, by the processor, the drawn triangle as a pattern over the solar field; and
    determining, by the processor, a placement of a lightning rod at each vertex of the tiled triangle pattern.

5. The method of claim 1, wherein at least one of the one or more circles of interference is located in a center of one of the one or more triangular heliostat structures.

6. The method of claim 1 further comprising:
    determining, by the processor, a base of non-interference, wherein the base of non-interference is a swept area on the ground from a center of the one or more circles of non-interference to a nearest edge of at least one of: the one or more heliostat structures and solar field equipment in the solar field.

7. The method of claim 1, wherein the determined placement of the one or more lightning rods by the rolling sphere method is in a hexagonal pattern.

8. The method of claim 7 further comprising:
    determining, by the processor, the number of lightning rods in the solar field in the hexagonal pattern by a vertex counting method.

9. The method of claim 1, wherein the placement of the one or more lightning rods in the one or more circles of non-interference further comprises placing a base of the lightning rod in a first determined circle of non-interference and placing an air electrode of the lightning rod in a second determined circle of non-interference.

10. The method of claim 9, wherein the first determined circle of non-interference has a larger volume than the second determined circle of non-interference.

11. A system, comprising:
a solar field;
one or more ungrounded triangular heliostat structures located in the solar field;
one or more heliostats disposed on corners of the one or more triangular heliostat structures;
a processor having addressable memory, wherein the processor is configured to:
  determine one or more circles of interference, wherein the one or more circles of interference are areas within a range of motion of the one or more heliostats;
  determine one or more circles of non-interference, wherein the one or more circles of non-interference are open spaces between the circles of interference; and
  determine a placement of one or more lightning rods in the determined one or more circles of non-interference, wherein the placement of the one or more lightning rods is based on a rolling sphere method.

12. The system of claim 11, wherein the one or more heliostats are arranged in a hexagonal heliostat packing.

13. The system of claim 12, wherein the hexagonal heliostat packing has a heliostat packing density of 20% to 50%.

14. The system of claim 11, wherein the one or more lightning rods comprise an air electrode located above the ground surface and a ground electrode located in the ground.

15. The system of claim 14, wherein the air electrode is detachably attached to the ground electrode.

16. The system of claim 14, wherein the air electrode is attached to a support structure.

17. The system of claim 14, wherein the ground electrode is located in a first determined circle of non-interference and the air electrode is located in a second determined circle of non-interference, wherein the first determined circle of non-interference has a larger volume than the second determined circle of non-interference.

18. The system of claim 14, wherein the ground electrode comprises one or more stakes used to support the air electrode.

19. A device comprising a processor having an addressable memory, wherein the processor is configured to:
determine a location of one or more ungrounded triangular heliostat structures in a solar field;
determine one or more circles of interference, wherein the one or more circles of interference are areas within a range of motion of one or more heliostats disposed on corners of the one or more triangular heliostat structures in the solar field;
determine one or more circles of non-interference, wherein the one or more circles of non-interference are open spaces between the circles of interference; and
determine a placement of one or more lightning rods in the one or more circles of non-interference, wherein the placement of the one or more lightning rods is based on a rolling sphere method.

* * * * *